(12) United States Patent
Beasom

(10) Patent No.: US 7,071,111 B2
(45) Date of Patent: Jul. 4, 2006

(54) SEALED NITRIDE LAYER FOR INTEGRATED CIRCUITS

(75) Inventor: James D. Beasom, Melbourne Village, FL (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 10/033,156

(22) Filed: Oct. 25, 2001

(65) Prior Publication Data

US 2003/0080395 A1 May 1, 2003

(51) Int. Cl.
*H01L 21/311* (2006.01)
*H01L 23/58* (2006.01)

(52) U.S. Cl. ..................... 438/696; 257/640
(58) Field of Classification Search ............. 438/385, 438/659, 238, 382, 384, 239, 696; 257/640
See application file for complete search history.

(56) References Cited

U.S. PATENT DOCUMENTS 5,679,601 A * 10/1997 Wu ............................. 437/69
6,486,033 B1 * 11/2002 Tu et al. ....................... 438/275
6,573,548 B1 * 6/2003 Leung et al. ................ 257/296
2001/0012655 A1 * 8/2001 Nordstom et al. .......... 438/239

OTHER PUBLICATIONS

S. Wollf and R.N. Tauber, "Silicon Processing for the VLSi Era: vol. 1—Process Technology," Lattice Press, Sunset Beach, CA (1986), pp. 321-324.*

* cited by examiner

*Primary Examiner*—Eddie Lee
(74) *Attorney, Agent, or Firm*—Fogg and Associates LLC; Scott V. Lundberg

(57) ABSTRACT

The present invention relates to an integrated circuit having a sealed nitride layer. In one embodiment, a method of forming a sealing nitride layer overlaying a silicon oxide layer in a contact opening of an integrated circuit is disclosed. The method comprises, forming a second layer of nitride overlaying a first layer of nitride to form the sealing nitride layer. The second layer of nitride further overlays an exposed portion of a surface of a substrate in the contact opening and sidewalls of the contact opening. Using reactive ion etching (RIE etch) without a mask to remove a portion of the second nitride layer adjacent the surface of the substrate in the contact opening to expose a portion of the surface of the substrate in the contact opening without removing portions of the second nitride layer covering the sidewalls of the contact opening.

16 Claims, 4 Drawing Sheets

SEALED NITRIDE LAYER FOR INTEGRATED CIRCUITS

TECHNICAL FIELD

The present invention relates generally to MOS devices incorporated in integrated circuits and in particular the present invention relates to a sealed nitride layer for an integrated circuit.

BACKGROUND

Integrated circuits incorporate complex electrical components formed in semiconductor material into a single device. Generally, an integrated circuit comprises a substrate upon which a variety of circuit components are formed wherein each of the circuit components are electrically isolated from each other. Integrated circuits are made of semiconductor material. Semiconductor material is material that has a resistance that lies between that of a conductor and an insulator. Semiconductor material is used to make electrical devices that exploit its resistive properties. A common type of structure is the metal-oxide semiconductor (MOS).

Semiconductor material is typically doped to be either a N type or a P type. N type semiconductor material is doped with a donor type impurity that generally conducts current via electrons. P type semiconductor material is doped with an acceptor-type impurity that conducts current mainly via hole migration. A N type or P type having a high impurity or high dopant concentration or density is denoted by a "+" sign. A N type or P type having a low impurity or low dopant concentration or density is denoted by a "−" sign.

Semiconductor devices are formed in a substrate of the integrated circuit. A typical semiconductor device is formed by selectively implanting dopants into the substrate to form device regions of either the P or N conductivity type. In addition, layers of dielectric material and metals are typically formed overlaying a surface of the substrate.

Some high reliability processes require a continuous silicon nitride (nitride) layer formed over the entire surface of the substrate of the integrated circuit. Generally, the nitride is deposited over the entire substrate surface by low pressure chemical vapor deposition (LPCVD) or plasma enhanced chemical vapor deposition (PECVD). The nitride layer is typically formed overlaying a patterned layer of silicon dioxide (oxide). The layer of nitride is used as a barrier to the diffusion of mobile ions. A diffusion barrier is desired because sodium and several other mobile ions tend to diffuse relatively rapidly to the surface of the substrate, which can degrade device performance. The layer of nitride is used to trap the mobile ions thereby prevention their diffusion to the surface of the substrate.

For improved performance, it is desired that the layer of nitride cover all of the oxide, even around the perimeter and sidewalls of contact openings through the oxide to the surface of the substrate. These contact openings are generally formed over device regions to provide a contact path. In forming nitride over oxide in sidewalls of contact openings, extra patterning steps that add cost to the manufacture of integrated circuits are required in the known art. It is desired in the art to form an integrated circuit with reduced process steps.

For the reasons stated above and for other reasons stated below which will become apparent to those skilled in the art upon reading and understanding the present specification, there is a need in the art for an integrated circuit with reduced process steps in forming an oxide sealed with nitride in contact openings.

SUMMARY

The above-mentioned problems are addressed, as well as other problems, by the present invention and will be understood by reading and studying the following specification.

In one embodiment, a method of forming a sealing nitride layer overlaying a oxide layer in a contact opening of an integrated circuit is disclosed. The method comprises, forming a second layer of nitride overlaying a first layer of nitride to form the sealing nitride layer. The second layer of nitride further overlays an exposed portion of a surface of a substrate in the contact opening and sidewalls of the contact opening. Using reactive ion etching (RIE etch) without a mask to remove a portion of the second nitride layer adjacent the surface of the substrate in the contact opening to expose a portion of the surface of the substrate in the contact opening without removing portions of the second nitride layer covering the sidewalls of the contact opening.

In another embodiment, a method of forming an integrated circuit is disclosed. The method comprising, forming a layer of oxide over a surface of a substrate. Forming a first layer of nitride overlaying the layer of oxide. Forming a contact opening through the first layer of nitride and the oxide layer to expose a portion of the surface of the substrate. Forming a second layer of nitride overlaying the first layer of nitride. The second layer of nitride also overlays the exposed portion of the surface of the substrate in the contact opening and sidewalls of the contact opening. Using a RIE etch without a mask on the substrate for a pre-determined amount of time to remove a portion of the second layer of nitride overlaying the surface of the substrate in the contact opening without removing the portions of the second nitride layer overlaying the sidewalls of the contact opening, wherein the oxide layer is sealed by the first and second nitride layers.

In another embodiment, a method of forming semiconductor devices in an integrated circuit. The method comprising forming a plurality of device regions of a first conductivity type in a substrate adjacent a surface of the substrate. Forming an oxide layer over a surface of a substrate. Patterning the oxide layer to exposed pre-selected portions of the surface of the substrate. Forming a first layer of nitride overlaying the oxide layer and the exposed portions of the surface of the substrate. Implanting ions of a second conductivity type through the layer of nitride into the substrate to form device regions of the second conductivity type, wherein remaining portions of the oxide layer under the nitride layer selectively stop the ions from entering the substrate to selectively define edges of the device regions of the second conductivity type. Forming contact openings to expose a portion of each of the device regions of the first and second conductivity type in the substrate. Forming a second layer of nitride over the first layer of nitride. The second layer of nitride also overlays the exposed portions of each of the device regions in their associated contact openings and sidewalls of each of the contact openings. Exposing the substrate to a RIE etch for a pre-determined amount of time to remove portions of the second layer of nitride adjacent a surface of each device region in an associated contact opening, wherein the substrate is not exposed to the RIE etch long enough to remove all of the portions of the second nitride layer overlaying the respective sidewalls of each of the contact openings so that the oxide layer remains sealed by the first and second layers of nitride.

In another embodiment, an integrated circuit comprising, a substrate, a plurality of semiconductor devices, a layer of oxide and first and second layers of nitride. The plurality semiconductor devices are formed in the substrate. Some of the semiconductor devices have device regions formed adjacent a surface of the substrate. The layer of oxide overlays the surface of the substrate. The first layer of nitride overlays the layer of oxide. The first layer of nitride and the layer of oxide have a plurality of contact openings that extend to select device regions in the substrate. The portions of a second layer of nitride overlay sidewalls of each contact opening. Each of the portions of the second layer of nitride is formed by first forming a second layer of nitride overlaying the first layer of nitride, the select device regions in the contact openings, and the sidewalls of the contact openings and then applying a RIE etch to the substrate without a mask for a predetermined amount of time.

BRIEF DESCRIPTION OF THE INVENTION

The present invention can be more easily understood and further advantages and uses thereof more readily apparent, when considered in view of the description of the preferred embodiments and the following figures in which.

In accordance with common practice, the various described features are not drawn to scale but are drawn to emphasize specific features relevant to the present invention. Reference characters denote like elements throughout Figures and text.

DETAILED DESCRIPTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

The present invention is related to the process of sealing oxide areas adjacent in sidewalls of contact openings in an integrated circuit with the use of nitride layers. In the following description, the term substrate is used to refer generally to any structure on which integrated circuits are formed, and also to such structures during various stages of integrated circuit fabrication. This term includes doped and undoped semiconductors, epitaxial layers of a semiconductor on a supporting semiconductor or insulating material, combinations of such layers, as well as other such structures that are known in the art. Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface (surface) of a wafer or substrate, regardless of the orientation of the wafer or substrate. The term "vertical" refers to a direction perpendicular to the horizontal. Terms, such as "on", "side" (as in "sidewall"), "higher", "lower", "over," "top" and "under" are defined with respect to the conventional plane or working surface being on the top surface of the wafer or substrate, regardless of the orientation of the wafer or substrate.

Figure 1:
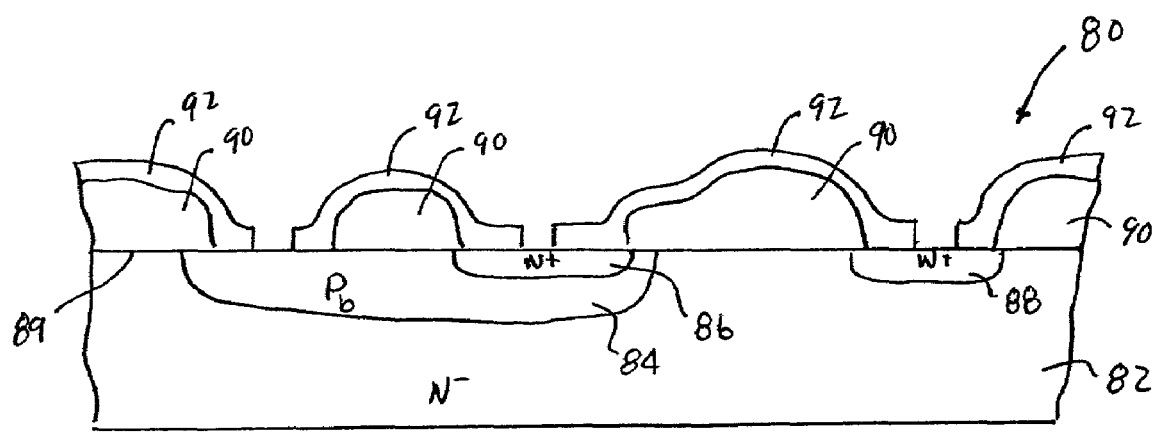
FIG. 1 is a cross-sectional view of a NPN transistor in an integrated circuit of the prior art.

Before the present invention is described in detail, a bipolar NPN transistor 80 of the prior art is illustrated in FIG. 1, to provide further background. As illustrated, this prior art device has in a substrate 82 of an integrated circuit. Formed in the substrate 82 is a base 84, an emitter 86 and a collector contact 88. A layer of oxide 90 is formed on the surface 89 of the substrate 82. The layer of oxide 90 is patterned to form contact openings to the base 84, emitter 86 and the collector contact 88 as illustrated in FIG. 1. A layer of nitride 92 is then deposited overlaying the oxide 90 and any exposed surface 89 of the substrate to seal the layer of oxide 90. In the prior art, a mask step or steps is then performed to pattern the layer of nitride to once again form contact openings to the base 84, emitter 86 and the collector contact 88. Accordingly, the contact openings through the layer of nitride 92 are nested inside the previously formed oxide contacts. These extra patterning steps to form the contact openings through the layer of nitride 92 add cost to the manufacture of integrated circuits as well as introduce alignment tolerance issues. One feature of the present invention reduces patterning steps required in making contact openings through layers of nitride and oxide.

Figure 2:
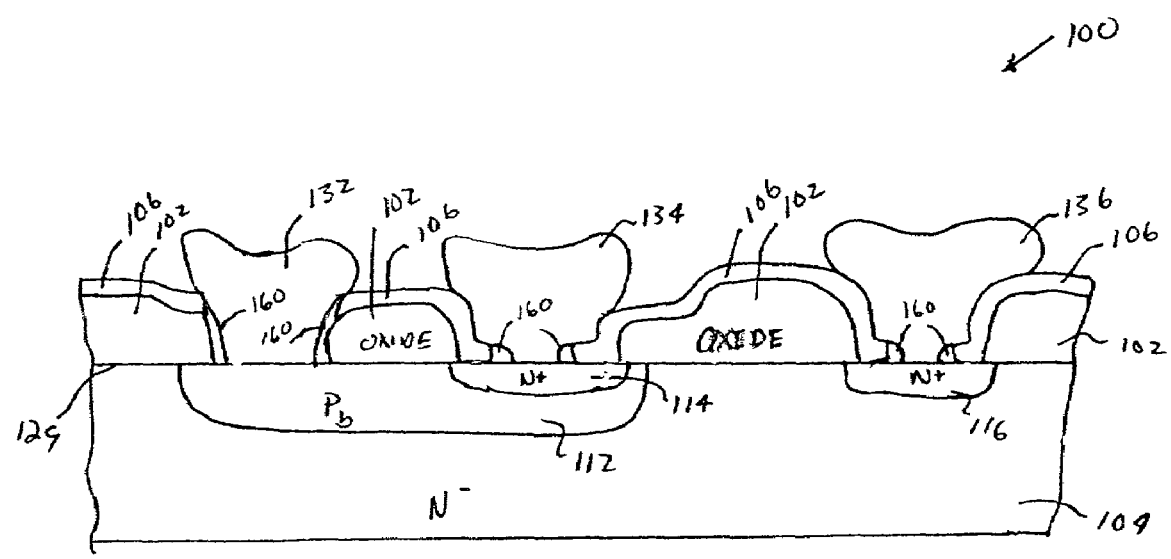
FIG. 2 is a cross-sectional view of a portion of an integrated circuit that includes a NPN transistor of one embodiment of the present invention.

In FIG. 2, a portion of an integrated circuit 100 of one embodiment of the present invention is illustrated. In particular, FIG. 2 illustrates a bipolar NPN transistor 103 of the integrated circuit 100. It will be understood in the art that the NPN transistor 103 would be isolated from other semiconductor devices formed in the substrate 104. It will also be understood in the art that a common way to isolate semiconductor devices in an integrated circuit is to create isolated islands in the substrate upon which they have been formed. An illustration of the formation of isolation islands is not shown since the formation of isolation islands are not needed in understanding of the present invention.

Referring to FIG. 2, the NPN transistor 103 is formed in a substrate 104 of the integrated circuit 100. The substrate 104 is of an N conductivity type with low dopant density. The NPN transistor 103 has a base 112 of the P conductivity type formed in the substrate 104 adjacent the surface 129 of the substrate 104. An emitter 114 of the N conductivity type with high dopant density is formed in the base 112 adjacent the surface 129 of the substrate. A collector contact 116 of the N conductivity type with high dopant density is formed in the substrate 104 adjacent the surface 129 of the substrate 104 and a predetermined distance from base 112. A base contact region 132 is coupled to the base 112. An emitter contact region 134 is coupled to the emitter 114. Moreover, a collector contact region 136 is coupled to the collector contact 116. In one embodiment, the base contact region 132, the emitter contact region 134 and the collector contact region 136 are patterned from a metal layer. FIG. 2, also illustrates, a first nitride layer 106 formed overlaying the areas of oxide layer 102 and a second nitride layer 160 formed to seal the oxide layer 102 in sidewalls of the contact openings.

The formation of one embodiment of the present invention is illustrated in FIGS. 3(A–F). Referring to FIG. 3A, the base device region 112 is formed in the substrate 104 adjacent the surface 129 of the substrate 129. In one embodiment, the base 112 is formed by implanting and diffusing P conductivity type dopants (or ions) in the substrate 104 using a mask to define the edges. The oxide layer 102 is then formed on the surface of the substrate. The layer of oxide 102 can be thermally grown, deposited or formed in any other manner known in the art or later developed. The layer of oxide 102 is then patterned to expose pre-selected areas of the substrate 104 surface 129, as illustrate in FIG. 3B. In particular, the layer of oxide 102 is selectively etched to form a pattern to define edges of subsequently formed N+device regions.

Figure 3A:
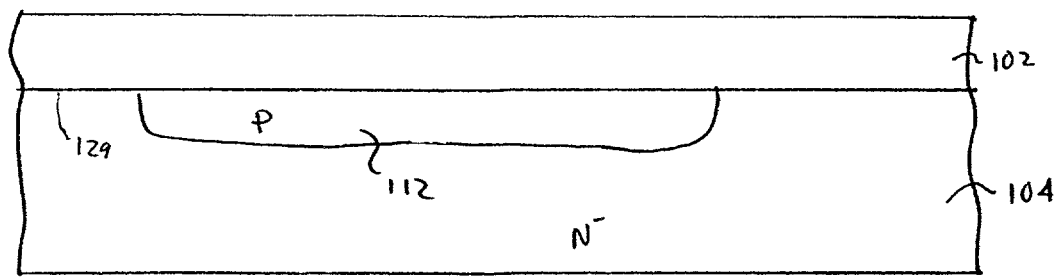
FIGS. 3(A–F) are cross-sectional views of the formation of one embodiment of the present invention.
Figure 3B:
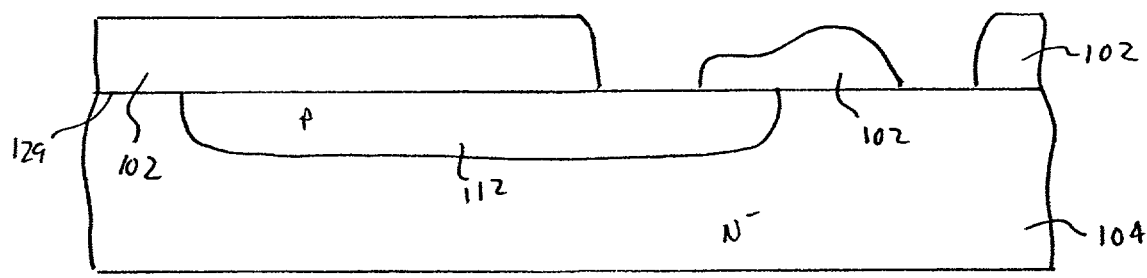
Figure 3C:
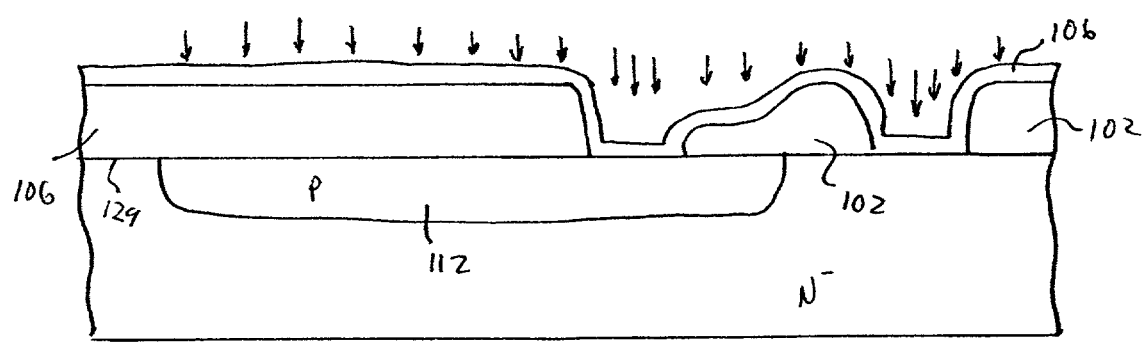
Figure 3D:
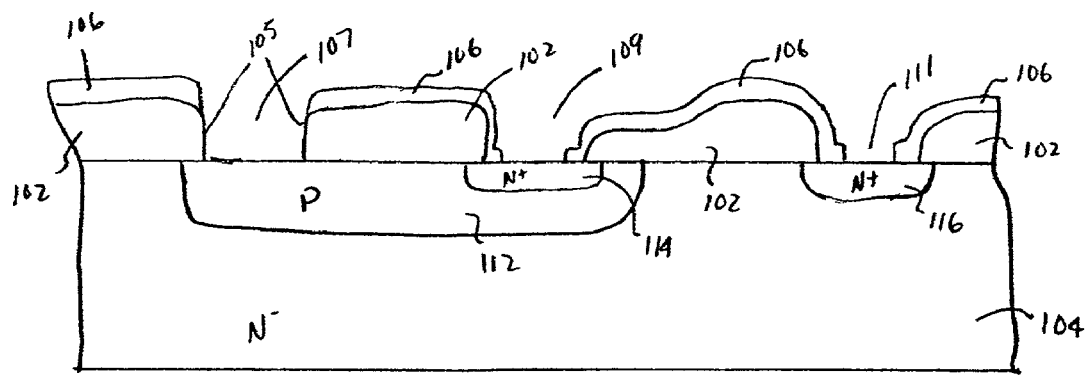

Referring to FIG. 3C, the first nitride layer 106 is then formed overlaying the remaining portions of oxide 102 and the exposed areas of substrate 104 surface 129. In one embodiment, the first layer of nitride 106 is deposited by low pressure chemical vapor deposition (LPCVD). However, it will be recognized in the art that there are other means for forming a high quality nitride layer, such as plasma enhanced chemical vapor deposition (PECVD), and that the present invention is not limited to LPCVD. The N+regions 114 and 116 are then formed. In one embodiment, the N+regions are formed by implanting high density N conductivity type ions through the first nitride layer 106 and then diffusing them to a final depth to respectively form an emitter 114 and collector contact 116 of the transistor 103. This is illustrated in FIGS. 3C and 3D. The remaining portion of the oxide layer 102, under the nitride layer 106, act a barrier to the ions to selectively define the edges of the N+regions 114 and 116 in the substrate 104.

Referring to FIG. 3D, apertures 107, 109 and 111 (contact openings) are then formed through the layer of nitride 106 and, where present, through the oxide 102. In one embodiment, the contact openings 107, 109 and 111 are done with a dry etch using a single mask. The use of a dry etch forms an anisotropic opening. That is, it forms a contact opening having generally vertical sidewalls. As illustrated in FIG. 3D, a portion of oxide layer 102 in contact opening 107 is exposed. That is, the vertical sidewalls 105 in contact opening 107 include exposed oxide surfaces. This could lead to mobile ions affecting the performance of the device.

Figure 3E:
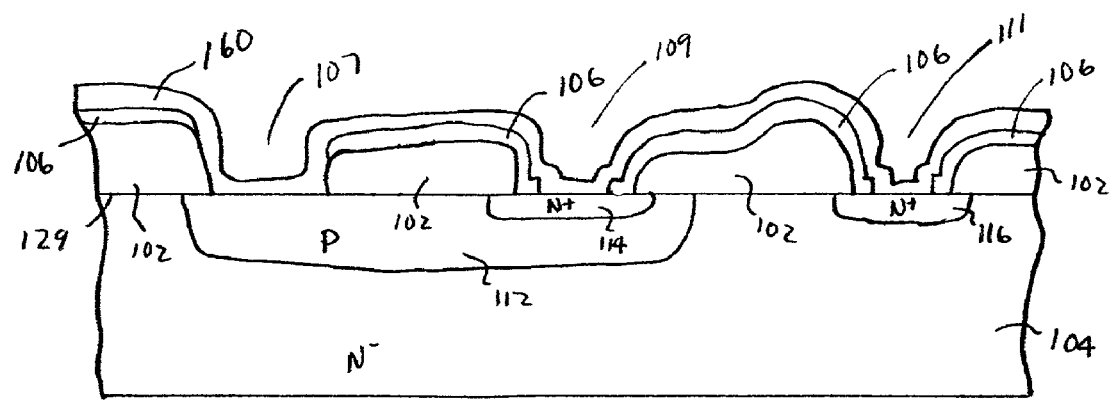

The second nitride layer 160 is formed overlaying the first nitride layer 106, the sidewalls of the contact openings 107, 109, 111 and the exposed area of the surface 129 of the substrate 104 in the respective contact openings 107, 109 and 111. This is illustrated in FIG. 3E. In one embodiment, the second layer of nitride 160 is deposited by LPCVD. However, it will be recognized in the art that there are other means for forming a high quality nitride layer, such as PECVD, and that the present invention is not limited to LPCVD.

Figure 3F:
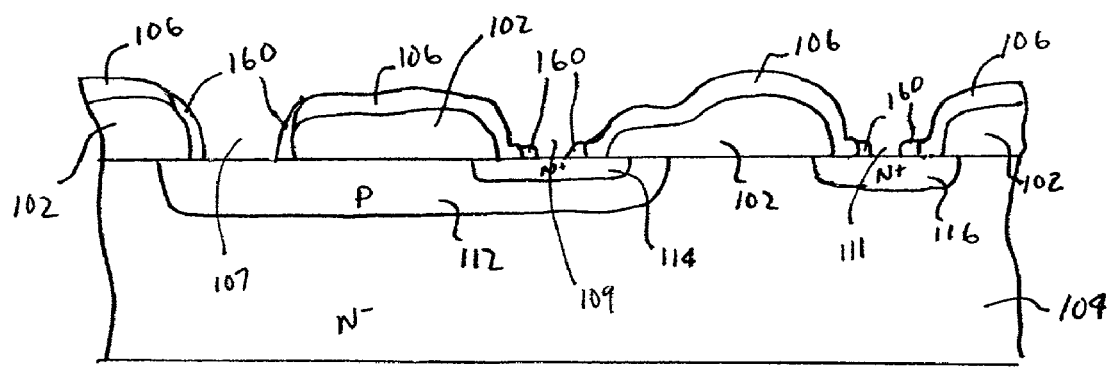

The substrate is then exposed to a reactive ion etching (RIE etch) without a mask to remove portions of the second layer of nitride 160. Exposure to the RIE etch is for a pre-determined amount of time. In particular, the RIE etch is timed to remove portions of the second layer of nitride 160 from the surface of the substrate in the contact openings 107, 109 and 111. Moreover, the RIE etch is timed so that all of the first layer of nitride 106 is not removed. After the exposure to the RIE etch, portions of the second layer of nitride 160 overlaying the sidewalls of the contact openings 107, 109 and 111 remain to seal the oxide layer 102. These portions of the second layer of nitride 160 remain after the RIE etch because the REI etch etches at a higher rate on exposed horizontal surfaces such as the bottom of the contacts and at a slow rate on exposed vertical surfaces such as the sidewalls of contact openings. Thus, it takes a longer exposure to the RIE etch for the vertical regions of the second layer of nitride 160 to be removed. The vertical regions of the second layer of nitride 160 are illustrated in FIG. 3F. As illustrated, the remaining vertical portions of the second layer of nitride 160 seal the oxide layer 102 in the sidewall of contact opening 107. Thus, an effective mobile ion barrier seals all the regions of the oxide layer 102. Typically, with the present invention, the vertical regions of nitride layers remaining after the RIE etch will be thinner than the remaining horizontal nitride layers. Wherein, the nitride layers that are horizontal are measured in a vertical direction and the nitride layers that are vertical (in the sidewalls of contact openings) are measured in a horizontal direction.

To achieve a nitride seal over the region of oxide layer 102 exposed in contact opening 107 in existing processes, two masks are typically used. A first mask forms the opening through the first layer of nitride 106 and the second mask of a smaller diameter forms an opening through the second layer of nitride 160. Embodiments of the present invention reduce the masking steps by eliminating the second mask. Moreover, the embodiments of the present invention provide a self-aligned relatively thin layer around the perimeter of the contact openings without a masking tolerance. That is, embodiments of the present invention eliminate the alignment tolerance of nesting one aperture inside another aperture as is required in existing techniques. An alignment tolerance is an uncertainty factor that is present whenever a mask is used which in existing techniques contributes to the non-alignment of the nesting apertures.

A layer of metal is then formed overlaying the substrate 104 and patterned to form the base contact region 132, the emitter contact region 134 and the collector contact region 136 in the respective contact opening, 107, 109 and 111, as illustrated in FIG. 2. As illustrated in FIG. 2, the oxide layer 102 is not in contact with base contact region 132.

Although the present invention has been described as being applied to a transistor in an integrated circuit, the present invention can be applied to any semiconductor device formed in an integrated circuit having contact openings through a nitride layer or a nitride and oxide layer to a surface of the substrate. Accordingly, the present invention is not limited to the formation of transistors.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of forming a sealing nitride layer overlaying an oxide layer in a contact opening of an integrated circuit, the method comprising:

forming a second layer of nitride overlaying a first layer of nitride without any intervening layers between the first and second layers of nitride to form the sealing nitride layer, the second layer of nitride further overlaying and in contact with an exposed portion of a surface of a substrate in the contact opening and sidewalls of the contact opening; and using reactive ion etching (RIE etch) without a mask to remove a portion of the second nitride layer adjacent the surface of the substrate in the contact opening to expose a portion of the surface of the substrate in the contact opening without removing portions of the second nitride layer covering the sidewalls of the contact opening.

2. The method of claim 1, wherein the second layer of nitride is formed by low pressure chemical vapor deposition.

3. The method of claim 1, wherein the second layer of nitride is formed by plasma enhanced chemical vapor deposition.

4. The method of claim 1, wherein, at least a portion of the first layer of nitride remains overlaying the oxide layer after the RIE etch is applied.

5. The method of claim 1, wherein the RIE etch is applied for a pre-determined amount of time.

6. The method of claim 5, wherein the pre-determined amount of time is the time it takes to remove a portion of the second layer of nitride from the surface of the substrate in the contact opening.

7. A method of forming an integrated circuit, the method comprising:
    forming a layer of oxide over a surface of a substrate;
    forming a first layer of nitride overlaying the layer of oxide;
    forming a contact opening through the first layer of nitride and the oxide layer to expose a portion of the surface of the substrate;
    forming a second layer of nitride overlaying the first layer of nitride, the second layer of nitride also overlaying the exposed portion of the surface of the substrate in the contact opening and sidewalls of the contact opening; and
    using a reactive ion etch (RIE etch) without a mask on the substrate for a pre-determined amount of time to remove a portion of the second layer of nitride overlaying the surface of the substrate in the contact opening without removing the portions of the second nitride layer overlaying the sidewalls of the contact opening and without removing portions of the first nitride layer overlaying the oxide layer, wherein the oxide layer is sealed by the first and second nitride layers.

8. The method of claim 7, wherein the contact opening through the first nitride layer and the oxide layer is done with a dry etch with one mask to form an anisotropic contact opening.

9. The method of claim 7, wherein the oxide layer is thermally grown.

10. The method of claim 7, wherein the oxide layer is deposited.

11. The method of claim 7, wherein the first and second layers of nitride are formed by low pressure chemical vapor deposition.

12. The method of claim 7, wherein the first and second layers of the nitride are formed by plasma enhanced chemical vapor deposition.

13. A method of forming semiconductor devices in an integrated circuit comprising:
    forming a plurality of device regions of a first conductivity type in a substrate adjacent a surface of the substrate;
    forming an oxide layer over a surface of a substrate;
    patterning the oxide layer to expose pre-selected portions of the surface of the substrate;
    forming a first layer of nitride overlaying the oxide layer and the exposed portions of the surface of the substrate;
    implanting ions of a second conductivity type through the layer of nitride into the substrate to form device regions of the second conductivity type, wherein remaining portions of the oxide layer under the nitride layer selectively stop the ions from entering the substrate to selectively define edges of the device regions of the second conductivity type;
    forming contact openings to expose a portion of each of the device regions of the first and second conductivity type in the substrate;
    forming a second layer of nitride over the first layer of nitride, the second layer of nitride also overlaying the exposed portions of each of the device regions in their associated contact openings and sidewalls of each of the contact openings; and
    exposing the substrate to a reactive ion etch (RIE etch) for a pre-determined amount of time to remove portions of the second layer of nitride adjacent a surface of each device region in an associated contact opening, wherein the substrate is not exposed to RIE etch long enough to remove all of the portions of the second nitride layer overlaying the respective sidewalls of each of the contact openings and portions of the first layer of nitride overlaying the oxide layer so that the oxide layer remains sealed by the first and second layers of nitride.

14. The method of claim 13, wherein the contact openings made through the first nitride layer and the oxide layer to associated device regions are done with a dry etch with a single mask to form anisotropic contact openings.

15. The method of claim 13, wherein the first and second layers of nitride are formed by low pressure chemical vapor deposition.

16. The method of claim 13, wherein the first and second layers of the nitride are formed by plasma enhanced chemical vapor deposition.

* * * * *